(12) United States Patent
Riad (10) Patent No.: US 9,768,774 B2
(45) Date of Patent: Sep. 19, 2017

(54) IMPEDANCE MATCHING DRIVER

(71) Applicant: FUJITSU LIMITED, Kawasaki-shi, Kanagawa (JP)

(72) Inventor: Tamer Riad, Dublin, CA (US)

(73) Assignee: FUJITSU LIMITED, Kawasaki (JP)

( * ) Notice: Subject to any disclaimer, the term of this patent is extended or adjusted under 35 U.S.C. 154(b) by 489 days.

(21) Appl. No.: 14/320,223

(22) Filed: Jun. 30, 2014

(65) Prior Publication Data

US 2015/0381173 A1 Dec. 31, 2015

(51) Int. Cl.
*H03K 3/00* (2006.01)
*H03K 19/00* (2006.01)

(52) U.S. Cl.
CPC .................. *H03K 19/0005* (2013.01)

(58) Field of Classification Search
CPC .................................. H03K 19/0005
USPC .......................................... 327/108
See application file for complete search history.

(56) References Cited

U.S. PATENT DOCUMENTS

| | | | | |
|---|---|---|---|---|
| 5,371,420 A * | 12/1994 | Nakao | ................... | H03K 17/167 326/27 |
| 6,140,885 A * | 10/2000 | Abadeer | ............. | H04L 25/0278 327/333 |
| 6,201,405 B1 * | 3/2001 | Hedberg | ........ | H03K 19/018557 326/30 |
| 6,351,172 B1 * | 2/2002 | Ouyang | ........... | H03K 19/00384 327/112 |
| 6,384,621 B1 * | 5/2002 | Gibbs | ................. | H03K 19/0005 326/30 |
| 6,480,178 B1 * | 11/2002 | Itakura | .................. | G09G 3/3688 330/251 |
| 7,109,759 B2 | 9/2006 | Tseng | | |
| 7,365,570 B2 * | 4/2008 | King | .............. | H03K 19/018521 326/30 |
| 7,376,205 B1 * | 5/2008 | Black | ................... | H04L 25/0288 375/297 |
| 7,760,180 B2 * | 7/2010 | Shimatani | ............ | G09G 3/3688 345/90 |

(Continued)

OTHER PUBLICATIONS

Menolfi, Christian., et al. "A 16Gb/s Source-Series Terminated Transmitter in 65nm CMOS SOI," Solid-State Circuits Conference, 2007. ISSCC 2007. Digest of Technical Papers. IEEE International, vol., No., pp. 446, 614, Feb. 11-15, 2007.

(Continued)

*Primary Examiner* — Ryan Jager
(74) *Attorney, Agent, or Firm* — Maschoff Brennan (57) ABSTRACT

A circuit may include an output circuit with an output circuit output impedance and a control circuit. The output circuit may include a driver circuit that includes an output terminal and a driver circuit output impedance at the output terminal. The output circuit may also include an adjustable impedance circuit that includes an adjustable impedance. The adjustable impedance circuit may be coupled between the output terminal of the driver circuit and a signal transmission line. The output circuit output impedance may be based on the driver circuit output impedance and the adjustable impedance. The control circuit may be coupled to the adjustable impedance circuit. The control circuit may be configured to adjust the adjustable impedance of the adjustable impedance circuit such that the output circuit output impedance approximately equals a particular impedance.

17 Claims, 5 Drawing Sheets

(56) References Cited

U.S. PATENT DOCUMENTS

| | | | |
|---|---|---|---|
| 7,863,946 B2* | 1/2011 | Ozasa | H03K 19/0005 307/98 |
| 8,198,912 B1 | 6/2012 | Thinakaran et al. | |
| 8,222,918 B1* | 7/2012 | Tan | H03K 19/018528 326/30 |
| 8,358,156 B1 | 1/2013 | Abugharbieh et al. | |
| 8,378,746 B2 | 2/2013 | Ding et al. | |
| 8,446,168 B2 | 5/2013 | Maarouf | |
| 2001/0000428 A1* | 4/2001 | Abadeer | H04L 25/0278 333/33 |
| 2006/0049893 A1* | 3/2006 | Ozasa | H03H 7/25 333/124 |
| 2008/0049872 A1* | 2/2008 | Fourtou | H03F 1/56 375/317 |
| 2013/0162300 A1 | 6/2013 | Liu et al. | |
| 2016/0094196 A1* | 3/2016 | Lee | H03F 3/45 333/2 |
| 2016/0099689 A1* | 4/2016 | Lee | H03F 1/56 330/252 |
| 2016/0259872 A1* | 9/2016 | Howald | G06F 17/5063 |
| 2016/0307736 A1* | 10/2016 | Howald | H01J 37/32183 |

OTHER PUBLICATIONS

Philpott, R.A., et al. "A 20Gb/s SerDes transmitter with adjustable source impedance and 4-tap feed-forward equalization in 65nm bulk CMOS," Custom Integrated Circuits Conference, 2008. CICC 2008. IEEE, vol., No., pp. 623, 626, Sep. 21-24, 2008.

Suzuki, K., et al. "A 24-Gb/s source-series terminated driver with inductor peaking in 28-nm CMOS," Solid State Circuits Conference (A-SSCC), 2012 IEEE Asian, vol., No., pp. 137, 140, Nov. 12-14, 2012.

Bulzacchelli, John F., et al. "A 28-Gb/s 4-Tap FFE/15-Tap DFE Serial Link Transceiver in 32-nm SOI CMOS Technology," Solid-State Circuits, IEEE Journal of, vol. 47, No. 12, pp. 3232, 3248, Dec. 2012.

Dettloff, W.D., et al. "A 32mW 7.4Gb/s protocol-agile source-series-terminated transmitter in 45nm CMOS SOI," Solid-State Circuits Conference Digest of Technical Papers (ISSCC), 2010 IEEE International, vol., No., pp. 370, 371, Feb. 7-11, 2010.

Chen, Shuai, et al. "A novel SST transmitter with mutually decoupled impedance self-calibration and equalization," Circuits and Systems (ISCAS), 2011 IEEE International Symposium on, vol., No., pp. 173, 176, May 15-18, 2011.

Knight, Thomas.F., Jr.; Krymm, A., "A self-terminating low-voltage swing CMOS output driver," Solid-State Circuits, IEEE Journal of, vol. 23, No. 2, pp. 457, 464, Apr. 1988.

Kossel, M.; Menolfi, C.; Weiss, J.; Buchmann, P.; von Bueren, G.; Rodoni, L.; Morf, T.; Toifl, T.; Schmatz, M., "A T-Coil-Enhanced 8.5Gb/s High-Swing source-Series-Terminated Transmitter in 65nm Bulk CMOS," Solid-States Circuits Conference, 2008. ISSCC 2008. Digest of Technical Papers. IEEE International, vol., No., pp. 110, 599, Feb. 3-7, 2008.

Wong, K.-L.J.; Hatamkhani, H.; Mansuri, M.; Yang, C.-K.K., "A 27-mW 3.6-gb/s I/O transceiver," Solid-State Circuits, IEEE Journal of, vol. 39, No. 4, pp. 602, 612, Apr. 2004.

Younus, M.; Hongjiang Song, "8Gbps high-speed I/O transmitter with scalable speed, swing and equalization levels," SOC Conference (SOCC), 2010 IEEE International, vol., No., pp. 301, 304, Sep. 27-29, 2010.

\* cited by examiner

IMPEDANCE MATCHING DRIVER

FIELD

The embodiments discussed herein are related to impedance matching drivers.

BACKGROUND

Many circuits today involve the use of high-speed transmitters that transmit signals over a channel to a receiver. As signals are transmitted over channels, the signals may be distorted such that information included in the signal may be altered. One cause of distortion of signals in a channel is due to impedance mismatches between an output of the transmitter and an input of the channel. Matching between the output of the transmitter and the input of the channel may be achieved when the impedance looking into the output of the transmitter, e.g., the output impedance of the transmitter, matches or approximately matches the impedance looking into the input of the channel, e.g., the input impedance of the channel.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include an output circuit with an output circuit output impedance and a control circuit. The output circuit may include a driver circuit that includes an output terminal and a driver circuit output impedance at the output terminal. The output circuit may also include an adjustable impedance circuit that includes an adjustable impedance. The adjustable impedance circuit may be coupled between the output terminal of the driver circuit and a signal transmission line. The output circuit output impedance may be based on the driver circuit output impedance and the adjustable impedance. The control circuit may be coupled to the adjustable impedance circuit. The control circuit may be configured to adjust the adjustable impedance of the adjustable impedance circuit such that the output circuit output impedance approximately equals a particular impedance.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a circuit is disclosed that matches or approximately matches an output impedance of a transmitter with an input impedance of a channel coupled to the transmitter. In particular, a circuit is disclosed that may be configured to determine a change in an output impedance of an output circuit and to adjust an adjustable impedance included in the output circuit based on the change to the output impedance such that the output impedance of the output circuit matches or approximately matches a particular impedance. In some embodiments, the particular impedance may be an input impedance of a channel coupled to the output of the output circuit.

Embodiments of the present disclosure will be explained with reference to the accompanying drawings.

Figure 1:
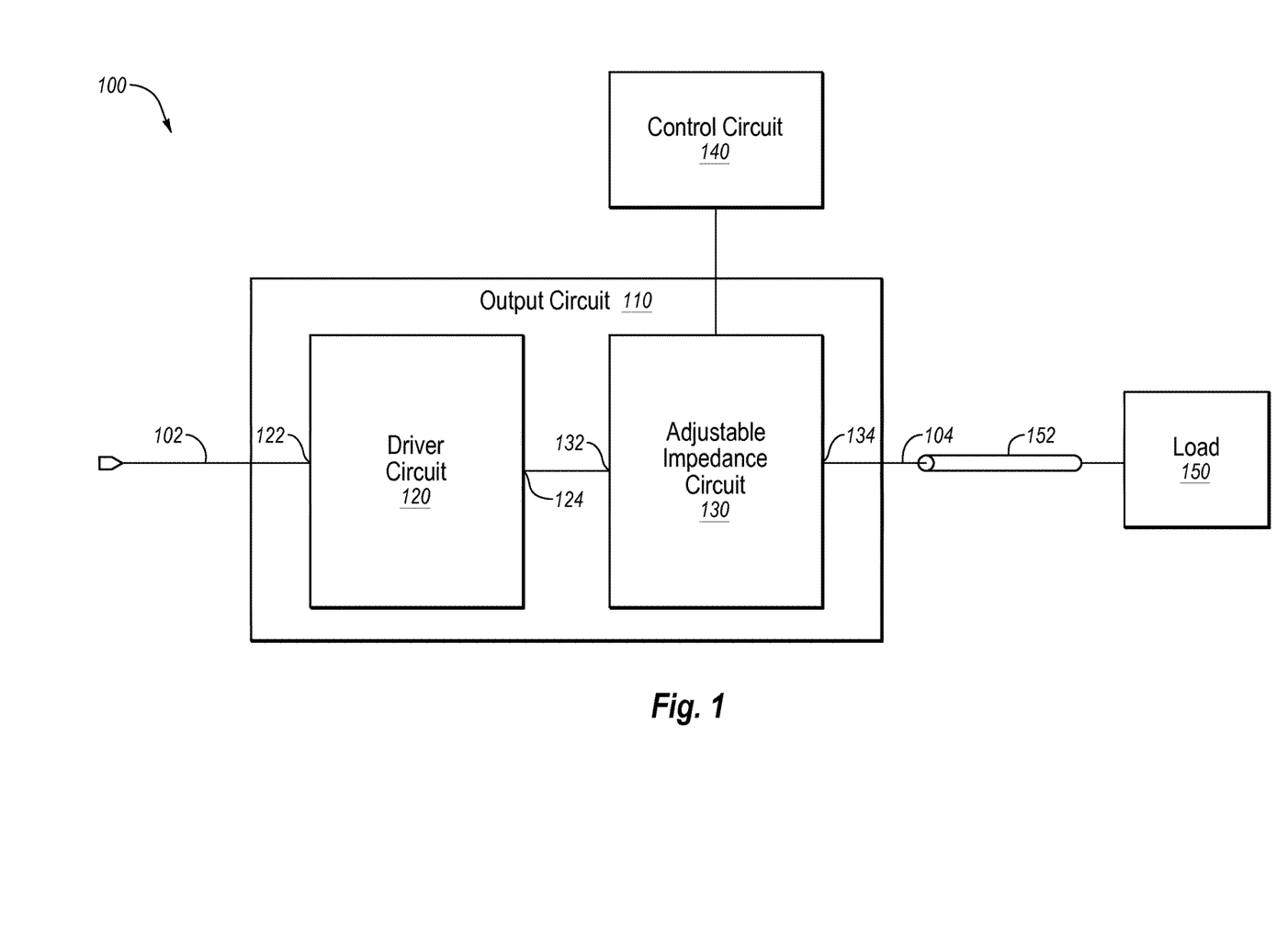
FIG. 1 is a diagram of an example circuit for impedance matching.

FIG. 1 is a diagram of an example circuit 100 for impedance matching, arranged in accordance with at least one embodiment described herein. The circuit 100 may include an output circuit 110 that includes a driver circuit 120 and an adjustable impedance circuit 130. The circuit 100 may further include a control circuit 140, a signal transmission line 152, and a load 150.

The output circuit 110 may include an input terminal 102 that is configured to receive a signal and an output terminal 104. The output terminal 104 may have an output impedance. The output terminal 104 may be coupled to the signal transmission line 152. The signal transmission line 152 may have an input impedance. The signal transmission line 152 may also be coupled to the load 150. The output circuit 110 may be configured to receive a signal on the input terminal 102 and to drive the signal on the output terminal 104 through the signal transmission line 152 to the load 150.

The driver circuit 120 may include an input terminal 122 and an output terminal 124. The input terminal 122 may be coupled to the input terminal 102 of the output circuit 110 and configured to receive an input signal on the input terminal 102. The driver circuit 120 may be configured to drive the input signal on the input terminal 102 to the output terminal 124. The driver circuit 120 may further include an output impedance at the output terminal 124. The output terminal 124 may be coupled to an input terminal 132 of the adjustable impedance circuit 130.

The adjustable impedance circuit 130 may include the input terminal 132 and an output terminal 134. The output terminal 134 may be coupled to the signal transmission line 152 such that signals driven by the driver circuit 120 are driven to the signal transmission line 152 to the load 150. In some embodiments, the load 150 may be a resistive load.

The adjustable impedance circuit 130 may include an adjustable impedance. A value of the adjustable impedance may be adjusted based on an impedance adjust voltage provided to the adjustable impedance circuit 130 from the control circuit 140. For example, in some embodiments, an increase in voltage of the impedance adjust voltage may decrease the adjustable impedance. Alternately or additionally, a decrease in voltage of the impedance adjust voltage may increase the adjustable impedance.

The output impedance of the output circuit 110 may be a product of a value of the adjustable impedance of the adjustable impedance circuit 130 and the output impedance of the driver circuit 120.

The control circuit 140 may be coupled to the adjustable impedance circuit 130 and may be configured to provide the adjustable impedance voltage to the adjustable impedance circuit 130 to adjust the impedance of the adjustable impedance circuit 130. In some embodiments, the control circuit 140 may generate the adjustable impedance voltage based on a change in the output impedance of the output circuit 110. In these and other embodiments, the generated adjustable impedance voltages may be configured to adjust the adjustable voltage of the adjustable impedance circuit 130 such that the output impedance of the output circuit 110 maintains approximately the same or the same as a particular impedance. Thus, the control circuit 140 may be configured to adjust the adjustable impedance of the adjustable impedance circuit 130 to compensate for changes in the output impedance of the driver circuit 120.

In some embodiments, the particular impedance may match or approximately match the input impedance of the signal transmission line 152. For example, the input impedance of the signal transmission line 152 may be 25 ohms, 50 ohms, 75 ohms, 100 ohms, or some other impedance. The particular impedance approximately matching the input impedance may indicate the particular impedance is plus or minus ten percent of the input impedance.

In some circumstances, the output impedance of the driver circuit 120 may change due to variations in the circuit 100, such as changes in temperature or supply voltages, among other changes. Alternately or additionally, the output impedance of the driver circuit 120 may vary slightly from the particular impedance after manufacturing due to process variations during manufacturing. The control circuit 140 may compensate for these and other types of output impedance changes of the driver circuit 120.

Modifications, additions, or omissions may be made to the circuit 100 without departing from the scope of the present disclosure. For example, in some embodiments, the circuit 100 may include additional passive or active circuit components. As another example, the circuit 100 may be configured for differential signals. In these and other embodiments, the output circuit 110 may drive a first signal of the differential signal and a second output circuit may drive a second signal of the differential signal. The second output circuit may include a second adjustable impedance circuit. An adjustable impedance of the second adjustable impedance circuit may be controlled by the control circuit 140.

Figure 2:
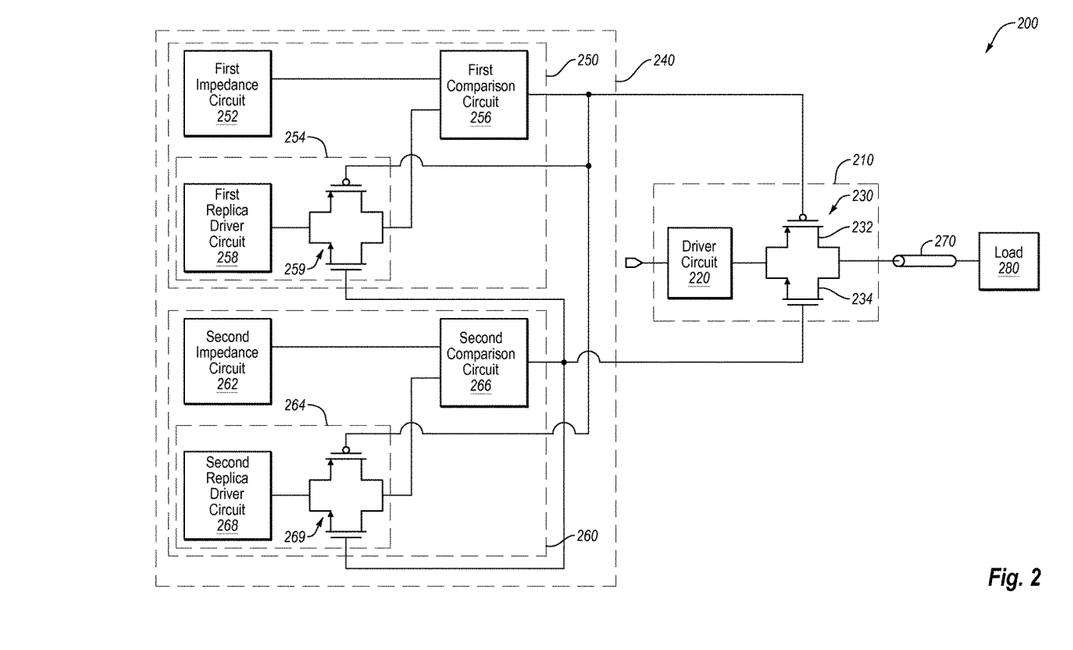
FIG. 2 is a diagram of another example circuit for impedance matching.

FIG. 2 is a diagram of another example circuit 200 for impedance matching, arranged in accordance with at least one embodiment described herein. The circuit 200 may include an output circuit 210, which includes a driver circuit 220 and an adjustable impedance circuit 230. The circuit 200 may further include a control circuit 240, a signal transmission line 270, and a load 280.

The output circuit 210 may be coupled to the signal transmission line 270 and may be configured to receive a signal and to drive the signal along the signal transmission line 270 to the load 280. The output circuit 210 may have an output impedance based on an output impedance of the driver circuit 220 and the adjustable impedance circuit 230.

The driver circuit 220 may include an input terminal and an output terminal. The output terminal may be coupled to the adjustable impedance circuit 230. The driver circuit 220 may be configured to drive a signal on the input terminal to the output terminal. The driver circuit 220 may further include an output impedance at the output terminal.

The adjustable impedance circuit 230 may include first and second transistors 232 and 234. Each of the first and second transistors 232 and 234 may include a gate terminal, a source terminal, and a drain terminal. As illustrated in FIG. 2, the source terminal may be the terminal with the arrow, the gate terminal may be the terminal with the parallel horizontal lines, and the drain terminal may be the other terminal.

The source terminals of the first and second transistors 232 and 234 may be coupled to the output terminal of the driver circuit 220. The drain terminals of the first and second transistors 232 and 234 may be coupled to the signal transmission line 270. The gates of the first and second transistors 232 and 234 may be coupled to the control circuit 240. In some embodiments, the first transistor 232 may be a p-type transistor and the second transistor 234 may be an n-type transistor.

Voltages at the gates of the first and second transistors 232 and 234 may be held at a level such that when a signal in a first state, such as a logical high state, is driven by the driver circuit 220, the change in the voltage at the source terminal of the first transistor 232 may cause the first transistor 232 to conduct, e.g., turn on, and pass the signal in the first state to the signal transmission line 270. Alternately or additionally, when a signal is driven by the driver circuit 220 in a second state, such as a logical low state, the change in the voltage at the source terminal of the second transistor 234 may cause the second transistor 234 to conduct and to pass the signal in the second state to the signal transmission line 270.

The impedance of the first and second transistors 232 and 234 may be adjustable. In some embodiments, the impedance of the first and second transistors 232 and 234 may be adjusted by adjusting first and second impedance adjust voltages applied to the respective gates of the first and second transistors 232 and 234. For example, the impedance, such as the resistance, between the source and drain terminals of the first and second transistors 232 and 234 may vary based on the first and second impedance adjust voltages applied to the respective gates of the first and second transistors 232 and 234. A change in the impedance of the channels of the first and second transistors 232 and 234 may result in a change in the impedance at the drains of the first and second transistors 232 and 234 and thus a change in the output impedance of the adjustable impedance circuit 230.

By adjusting the impedances of the first and second transistors 232 and 234, the output impedance of the output circuit 210 may be adjusted by the control circuit 240. In particular, the output impedance of the output circuit 210 may be adjusted such that the output impedance of the output circuit 210 matches or approximately matches a particular impedance, such as an input impedance of the signal transmission line 270.

The control circuit 240 may be configured to control the first and second impedance adjust voltages applied to the respective first and second transistors 232 and 234. In some embodiments, the control circuit 240 may be configured to detect a change in the output impedance of the output circuit 210 with respect to the particular impedance. After detecting the change in the output impedance, the control circuit 240 may adjust the first and second impedance adjust voltages applied to the first and second transistors 232 and 234 to adjust the output impedance of the output circuit 210 until the output impedance of the output circuit 210 matches or approximately matches the particular impedance.

To detect a change in the output impedance and to adjust the first and second impedance adjust voltages, the control circuit 240 may include a first portion 250 and a second portion 260.

The first portion 250 may be configured to detect a change in the output impedance of the output circuit 210 when a signal driven by the output circuit 210 is in a first state. For example, the first state may be a high state or a logical high state of the signal. The first portion 250 may adjust the first impedance adjust voltage to adjust the impedance of the first transistor 232 based on the change in the output impedance of the output circuit 210.

The second portion 260 may be configured to detect a change in the output impedance of the output circuit 210 when a signal driven by the output circuit 210 is in a second state. For example, the second state may be a low state or a logical low state of the signal. The second portion 260 may then adjust the second impedance adjust voltage to adjust the impedance of the second transistor 234 based on the change in the output impedance of the output circuit 210. In this manner, the control circuit 240 may adjust the first and second transistors 232 and 234 individually and may compensate for changes in the output impedance of the output circuit 210 even when the changes are not consistent for varying states of a signal that is driven by the output circuit 210.

The first portion 250 may include a first impedance circuit 252, a first replica output circuit 254, and a first comparison circuit 256. The first impedance circuit 252 may be coupled to the first comparison circuit 256. The first replica output circuit 254 may be coupled to the first comparison circuit 256. The first comparison circuit 256 may be coupled to the gate of the first transistor 232 of the adjustable impedance circuit 230.

The first impedance circuit 252 may have an output impedance that is related to the particular impedance. In some embodiments, the first impedance circuit 252 may have an output impedance that matches or approximately matches the particular impedance. In these and other embodiments, the particular impedance may match or approximately match the input impedance of the signal transmission line 270. A first impedance voltage may be generated using the first impedance circuit 252. The first impedance voltage may be provided to the first comparison circuit 256. A level of the first impedance voltage may represent a voltage that is generated by a circuit with an output impedance that approximately matches, matches, or that is related to the particular impedance. In particular, the first impedance voltage may represent a voltage that is generated by a circuit with an output impedance that approximately matches, matches, or that is related to the particular impedance when a signal that passes through the particular impedance is in a first state, such as a high state or a logical high state.

The first replica output circuit 254 may be a scaled replica of the output circuit 210. The first replica output circuit 254 may include a first replica driver circuit 258 that is a scaled replica of the driver circuit 220 and a first replica adjustable impedance circuit 259 that is a scaled replica of the adjustable impedance circuit 230. A second impedance voltage may be generated based on an output impedance of the first replica output circuit 254 and provided to the first comparison circuit 256.

The first replica driver circuit 258 may be configured to drive a signal that is similar to or equivalent of a signal in a first state, such as a high state or a logical high state, that is driven by the driver circuit 220. When the first replica driver circuit 258 is scaled to be the same as the driver circuit 220, the first replica driver circuit 258 and the driver circuit 220 may be the same or approximately the same within manufacturing tolerances. When the first replica driver circuit 258 is scaled to be different than the driver circuit 220, the first replica driver circuit 258 and the driver circuit 220 may include the same or approximately the same logical circuits, but one or more transistors in the driver circuit 220 may have channels with widths that are larger than the widths of channels of transistors in the first replica driver circuit 258. In these and other embodiments, the first replica driver circuit 258 and the driver circuit 220 may include similar or the same functionality with similar or the same arrangement of active and/or passive components. The difference between the first replica driver circuit 258 and the driver circuit 220 may be the difference in transistor channel widths included in the first replica driver circuit 258 and the driver circuit 220.

The first replica adjustable impedance circuit 259 may operate in a similar manner as the adjustable impedance circuit 230. In particular, the first replica adjustable impedance circuit 259 may receive the first and second impedance adjust voltages provided to the adjustable impedance circuit 230. The first and second impedance adjust voltages may adjust the adjustable impedance of the first replica adjustable impedance circuit 259 in a similar manner as the first and second impedance adjust voltages adjust the adjustable impedance of the adjustable impedance circuit 230.

When the first replica adjustable impedance circuit 259 is scaled to be the same as the adjustable impedance circuit 230, the first replica adjustable impedance circuit 259 and the adjustable impedance circuit 230 may be the same or approximately the same within manufacturing tolerances. When the first replica adjustable impedance circuit 259 is scaled to be different than the adjustable impedance circuit 230, the first replica adjustable impedance circuit 259 and the adjustable impedance circuit 230 may include the same or approximately the same logical circuits, but one or more transistors in the adjustable impedance circuit 230 may include channels with widths that are larger than the widths of channels in transistors in the first replica adjustable impedance circuit 259. In these and other embodiments, the first replica adjustable impedance circuit 259 and the adjustable impedance circuit 230 may include the same or approximately the same functionality with the same or approximately the same active and/or passive components. The difference between the first replica adjustable impedance circuit 259 and the adjustable impedance circuit 230 may be the difference in transistor channel widths included in the first replica adjustable impedance circuit 259 and the adjustable impedance circuit 230.

In embodiments where the first replica output circuit 254 is scaled to be different from the output circuit 210, the first impedance circuit 252 may relate to the particular impedance based on a ratio between the first replica output circuit 254 and the output circuit 210. For example, assume the particular impedance is 50 ohms. When the first impedance circuit 252 is 200 ohms, the ratio between the first replica output circuit 254 and the output circuit 210 may be four. As a result, channel widths of transistors in the output circuit 210 may be four times the channel widths of transistors in the first replica output circuit 254. Increasing the impedance of the first impedance circuit 252 may reduce the current when the first impedance voltage is generated thereby reducing the power consumption of the circuit 200. Furthermore, scaling of the first impedance circuit 252 and the output circuit 210 may not affect the operation of the circuit 200 other than to reduce the power consumption of the circuit 200.

The first comparison circuit 256 may be configured to receive the first and second impedance voltages. The first comparison circuit 256 may generate the first impedance adjust voltage based on the comparison of the first and second impedance voltages. The first comparison circuit 256 may provide the first impedance adjust voltage to the adjustable impedance circuit 230, to the first replica adjustable impedance circuit 259, and to the second portion 260 as discussed below. Providing the first impedance voltage to the first replica adjustable impedance circuit 259 may create a feedback loop because the second voltage generated based on the first replica adjustable impedance circuit 259 is used to generate the first impedance voltage.

An example of the operation of the first portion 250 follows assuming that the scaled ratio applied to the output circuit 210 and the first impedance circuit 252 is one. To begin, the first comparison circuit 256 may receive the first and second impedance voltages. When the first and second impedance voltages are approximately the same or the same, the first comparison circuit 256 may maintain the first impedance adjust voltage. When the first and second impedance voltages are approximately the same, then the output impedance of the first replica output circuit 254 and the output impedance of the first impedance circuit 252 are approximately the same. Because the first replica output circuit 254 is a replica of the output circuit 210, the output impedance of the output circuit 210 may be approximately the same as the particular impedance.

A change in the temperature, voltage, or some other aspect of the circuit 200 may cause the output impedance of the output circuit 210 to change. Because the first replica output circuit 254 is a replica of the output circuit 210, the output impedance of the first replica output circuit 254 may also change. A change in the output impedance of the first replica output circuit 254 may result in a change of the second impedance voltage such that the second impedance voltage does not match or approximately match the first impedance voltage. In this manner, the first portion 250 may detect a change in the output impedance of the output circuit 210 and in particular, a change in the output impedance of the output circuit 210 when a signal driven by the driver circuit 220 is in a first state.

Based on the difference between the first and second impedance voltages, the first comparison circuit 256 may adjust the first impedance adjust voltage. The change in the first impedance adjust voltage may result in a change in the output impedance of the first replica output circuit 254 and the output circuit 210 when the signal is in the first state. The first comparison circuit 256 may continue to adjust the first impedance adjust voltage until the output impedance of the first replica output circuit 254 matches or approximately matches the output impedance of the first impedance circuit 252 based on the first and second impedance voltages being the same or approximately the same. Because the output impedance of the first impedance circuit 252 matches or approximately matches the particular impedance and the output impedance of the first replica output circuit 254 matches or approximately matches the output impedance of the output circuit 210, the output impedance of the output circuit 210 may match or approximately match the particular impedance when the signal is in the first state. After the first and second impedances voltages match or approximately match, the first comparison circuit 256 may maintain the first impedance adjust voltage such that the output impedance of the output circuit 210 may continue to match or approximately match the particular impedance.

In some embodiments, due to manufacturing variations when power is first supplied to the circuit 200 the output impedance of the output circuit 210 and the first replica output circuit 254 may be different than the particular impedance and the output impedance of the first impedance circuit 252. The first portion 250 may act as described above to adjust the output impedance of the first transistor 232 to cause the output impedance of the output circuit 210 to match or approximately match the particular impedance when a signal driven by the driver circuit 220 is in a first state.

When the first impedance circuit 252 and the output circuit 210 are scaled with respect to the particular impedance and the first replica output circuit 254, the scaling may cancel out such that the circuit 200 operates in a similar manner as described above to cause the output impedance of the output circuit 210 when the signal is in the first state to match or approximately match the particular impedance.

The second portion 260 may include a second impedance circuit 262, a second replica output circuit 264, and a second comparison circuit 266. The second impedance circuit 262 may be coupled to the second comparison circuit 266. The second replica output circuit 264 may be coupled to the second comparison circuit 266. The second comparison circuit 266 may be coupled to the gate of the second transistor 234 of the adjustable impedance circuit 230.

The second impedance circuit 262 may have an output impedance that is related to the particular impedance. In some embodiments, the second impedance circuit 262 may have an output impedance that is equal or approximately equal to the particular impedance. In these and other embodiments, the particular impedance may be equal or approximately equal to the input impedance of the signal transmission line 270. A third impedance voltage may be generated using the second impedance circuit 262. The third impedance voltage may be provided to the second comparison circuit 266. A level of the third impedance voltage may represent a voltage that is generated by a circuit with an output impedance that is approximately equal, equal to, or related to the particular impedance. In particular, the third impedance voltage may represent a voltage that is generated by a circuit with an output impedance that is approximately equal, equal to, or related to the particular impedance when a signal that passes through the particular impedance is in a second state, such as a low state or a logical low state.

The second replica output circuit 264 may be a scaled replica of the output circuit 210. The second replica output circuit 264 may include a second replica driver circuit 268 that is a scaled replica of the driver circuit 220 and a second replica adjustable impedance circuit 269 that is a scaled replica of the adjustable impedance circuit 230. A fourth impedance voltage may be generated based on the second replica output circuit 264 and provided to the second comparison circuit 266.

The second replica driver circuit 268 may be configured to drive a signal that is similar to or equivalent of a signal in a second state, such as a low state or a logical low state, which is driven by the driver circuit 220. When the second replica driver circuit 268 is scaled to be the same as the driver circuit 220, the second replica driver circuit 268 and the driver circuit 220 may be the same or approximately the same within manufacturing tolerances. When the second replica driver circuit 268 is scaled to be different than the driver circuit 220, the second replica driver circuit 268 and the driver circuit 220 may include the same or approximately the same logical circuits, but one or more transistors in the driver circuit 220 may have channels with widths that are larger than the widths of channels of transistors in the second replica driver circuit 268. In these and other embodiments, the second replica driver circuit 268 and the driver circuit 220 may include similar or the same functionality with similar or the same arrangement of active and/or passive components. The difference between the second replica driver circuit 268 and the driver circuit 220 may be the difference in transistor channel widths included in the second replica driver circuit 268 and the driver circuit 220.

The second replica adjustable impedance circuit 269 may operate in a similar manner as the adjustable impedance circuit 230. In particular, the second replica adjustable impedance circuit 269 may receive the first and second impedance adjust voltages provided to the adjustable impedance circuit 230. The first and second impedance adjust voltages may adjust the adjustable impedance of the second replica adjustable impedance circuit 269 in a similar manner as the first and second impedance adjust voltages adjust the adjustable impedance of the adjustable impedance circuit 230.

When the second replica adjustable impedance circuit 269 is scaled to be the same as the adjustable impedance circuit 230, the second replica adjustable impedance circuit 269 and the adjustable impedance circuit 230 may be the same or approximately the same within manufacturing tolerances. When the second replica adjustable impedance circuit 269 is scaled to be different than the adjustable impedance circuit 230, the second replica adjustable impedance circuit 269 and the adjustable impedance circuit 230 may include the same or approximately the same logical circuits, but one or more transistors in the adjustable impedance circuit 230 may include channels with widths that are larger than widths of channels in transistors in the second replica adjustable impedance circuit 269. In these and other embodiments, the second replica adjustable impedance circuit 269 and the adjustable impedance circuit 230 may include the same or approximately the same functionality with the same or approximately the same active and/or passive components. The difference between the second replica adjustable impedance circuit 269 and the adjustable impedance circuit 230 may be the difference in transistor channel widths included in the second replica adjustable impedance circuit 269 and the adjustable impedance circuit 230.

In embodiments where the second replica output circuit 264 is scaled to be different than the output circuit 210, the second impedance circuit 262 may relate to the particular impedance based on a ratio between the second replica output circuit 264 and the output circuit 210 in a similar manner as described above with respect to elements in the first portion 250.

The second comparison circuit 266 may be configured to receive the third and fourth impedance voltages. The second comparison circuit 266 may generate the second impedance adjust voltage based on the comparison of the third and fourth impedance voltages. The second comparison circuit 266 may provide the second impedance adjust voltage to the adjustable impedance circuit 230, to the first replica adjustable impedance circuit 259, and to the second replica adjustable impedance circuit 269. Providing the output impedance voltage to the second replica adjustable impedance circuit 269 may create a feedback loop because the fourth voltage is used to generate the second impedance voltage, which is generated based on the second replica adjustable impedance circuit 269.

The second portion 260 may operate in a similar manner as described above with respect to the first portion 250 to detect a change in the output impedance of the output circuit 210 when a signal driven by the driver circuit 220 is in a second state and to adjust the second impedance voltage accordingly such that the output impedance of the output circuit 210 may continue to match or approximately match the particular impedance.

With the first portion 250 adjusting the first impedance adjust signal and the second portion 260 adjusting the second impedance adjust signal, the output impedance of the output circuit 210 may be adjusted to match or approximately match the particular impedance when driving a signal in either a first state or a second state.

Modifications, additions, or omissions may be made to the circuit 200 without departing from the scope of the present disclosure. For example, in some embodiments, the circuit 200 may include one or more passive or active circuit elements. As another example, the circuit 200 may be configured for differential signals. In these and other embodiments, the output circuit 210 may drive a first signal of the differential signal and a second output circuit may drive a second signal of the differential signal. The second output circuit may include a second adjustable impedance circuit, the impedance of which is controlled by the control circuit 240.

Figure 3:
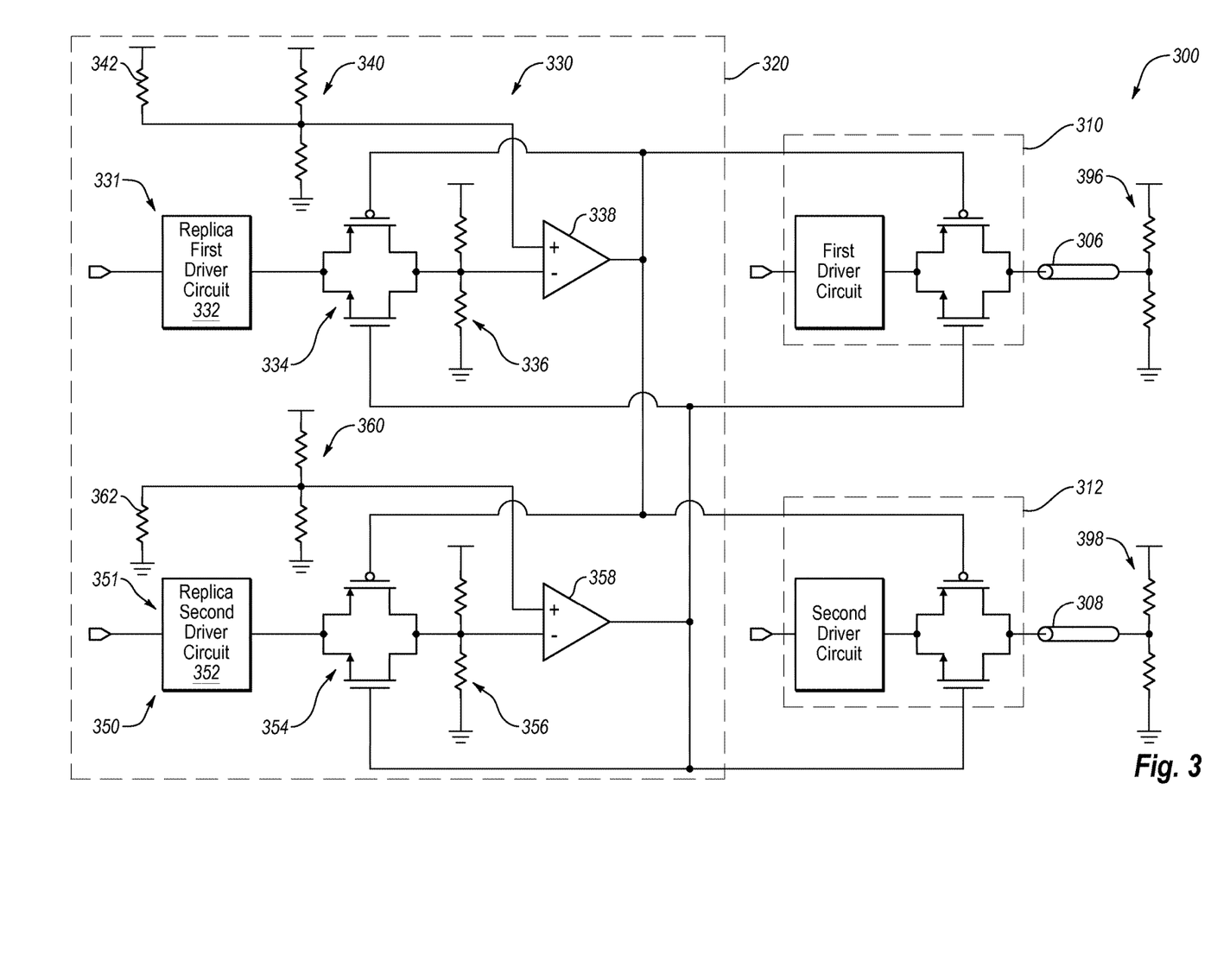
FIG. 3 is a diagram of another example circuit for impedance matching.

FIG. 3 is a diagram of another example circuit 300 for impedance matching, arranged in accordance with at least one embodiment described herein. The circuit 300 may be configured for differential signals. As a result, the circuit 300 may include a first output circuit 310 and a second output circuit 312. The second output circuit 312 may be a replica of the first output circuit 310. The first output circuit 310 may be configured to drive a first signal of the differential signal and the second output circuit 312 may be configured to drive a second signal of the differential signal in a similar manner.

Furthermore, the first and second output circuits 310 and 312 may have output impedances that may be adjusted to match a particular impedance. The first and second output circuits 310 and 312 may each be analogous to the output circuit 210 of FIG. 2 and no further description is provided herein.

The first output circuit 310 may be coupled to a first signal transmission line 306 that is coupled to a first load 396. The second output circuit 312 may be coupled to a second signal transmission line 308 that is coupled to a second load 398. In some embodiments, the particular impedance may be an input impedances of the first signal transmission line 306 and the second signal transmission line 308.

The circuit 300 may further include a control circuit 320 coupled to the first and second output circuits 310 and 312. The control circuit 320 may be analogous in operation to the control circuit 240 of FIG. 2. FIG. 3, however, illustrates further details of various elements of the control circuit 320.

The control circuit 320 includes a first portion 330 and a second portion 350. The first portion 330 may be analogous to the first portion 250 of FIG. 2 and the second portion 260 may be analogous to the second portion 260 of FIG. 2.

The first portion 330 may include a replica first output circuit 331 that includes a replica first driver circuit 332 and a replica first adjustable impedance circuit 334. The first portion 330 may further include a second replica first load 336, a first differential amplifier 338, a first replica first load 340, and a first resistance 342.

The second portion 350 may include a replica second output circuit 351 that includes a replica second driver circuit 352 and a replica second adjustable impedance circuit 354. The second portion 350 may further include a second replica second load 356, a second differential amplifier 358, a first replica second load 360, and a second resistance 362.

In the first portion 330, the first resistance 342 may be coupled between a voltage source (VCC) and a first input of the first differential amplifier 338. The first resistance 342 may be an example of the first impedance circuit 252 of FIG. 2. The first resistance 342 may have a resistance as seen at an input of the first differential amplifier 338 that is related to the particular impedance. In some embodiments, the first resistance 342 may be the particular impedance or a scaled version of the particular impedance. The first resistance 342 and the first replica first load 340 may generate a first impedance voltage that may be provided to the first input of the first differential amplifier 338. The first impedance voltage may represent an impedance that is related to the particular impedance.

The replica first driver circuit 332 and the replica first adjustable impedance circuit 334 of the first portion 330 may be analogous to the first replica driver circuit 258 and the first replica adjustable impedance circuit 259 of FIG. 2. The replica first adjustable impedance circuit 334 may be coupled to the second replica first load 336. The second replica first load 336 may be a replica of the first load 396. The second replica first load 336 may receive a current signal driven by the replica first driver circuit 332 through the replica first adjustable impedance circuit 334. The second replica first load 336 may generate a second impedance voltage that may be provided to the first differential amplifier 338. The second impedance voltage may represent an output impedance of the replica first output circuit 331.

The first differential amplifier 338 may compare the first and second impedance voltages and generate a first impedance adjust voltage based on the comparison. In some embodiments, the first differential amplifier 338 may be an error amplifier. The first impedance adjust voltage may adjust the output impedance of the first and second output circuits 310 and 312 as well as the output impedances of the replica first output circuit 331 and the replica second output circuit 351. The first portion 330 may further operate in a manner analogous to the operation of the first portion 250 of FIG. 2, described above.

In the second portion 350, the second resistance 362 may be coupled between ground and a first input of the second differential amplifier 358. The second resistance 362 may be an example of the second impedance circuit 262 of FIG. 2. The second resistance 362 may have a resistance as seen at an input of the second differential amplifier 358 that is related to the particular impedance. In some embodiments, the second differential amplifier 358 may be an error amplifier In some embodiments, the second resistance 362 may be the particular impedance or a scaled version of the particular impedance. The second resistance 362 and the first replica second load 360 may generate a third impedance voltage that may be provided to the first input of the second differential amplifier 358. The third impedance voltage may represent an impedance that is related to the particular impedance.

The replica second driver circuit 352 and the replica second adjustable impedance circuit 354 of the second portion 350 may be analogous to the second replica driver circuit 268 and the second replica adjustable impedance circuit 269 of FIG. 2. The replica second adjustable impedance circuit 354 may be coupled to the second replica second load 356. The second replica second load 356 may be a replica of the second load 398. The second replica second load 356 may receive a current signal driven by the replica second driver circuit 352 through the replica second adjustable impedance circuit 354. The second replica second load 356 may generate a fourth impedance voltage that may be provided to the second differential amplifier 358. The fourth impedance voltage may represent an output impedance of the replica second output circuit 351.

The second differential amplifier 358 may compare the third and fourth impedance voltages and generate a second impedance adjust voltage based on the comparison. The second impedance adjust voltage may adjust the output impedance of the first and second output circuits 310 and 312 as well as the output impedances of the replica first output circuit 331 and the replica second output circuit 351. The second portion 350 may further operate in a manner analogous to the operation of the second portion 260 of FIG. 2, described above.

Modifications, additions, or omissions may be made to the circuit 300 without departing from the scope of the present disclosure. For example, in some embodiments, the circuit 300 may include one or more additional active or passive devices. Alternately or additionally, the circuit 300 may not include the second output circuit 312. In these and other embodiments, the circuit 300 may be configured for a single-ended signal.

Figure 4:
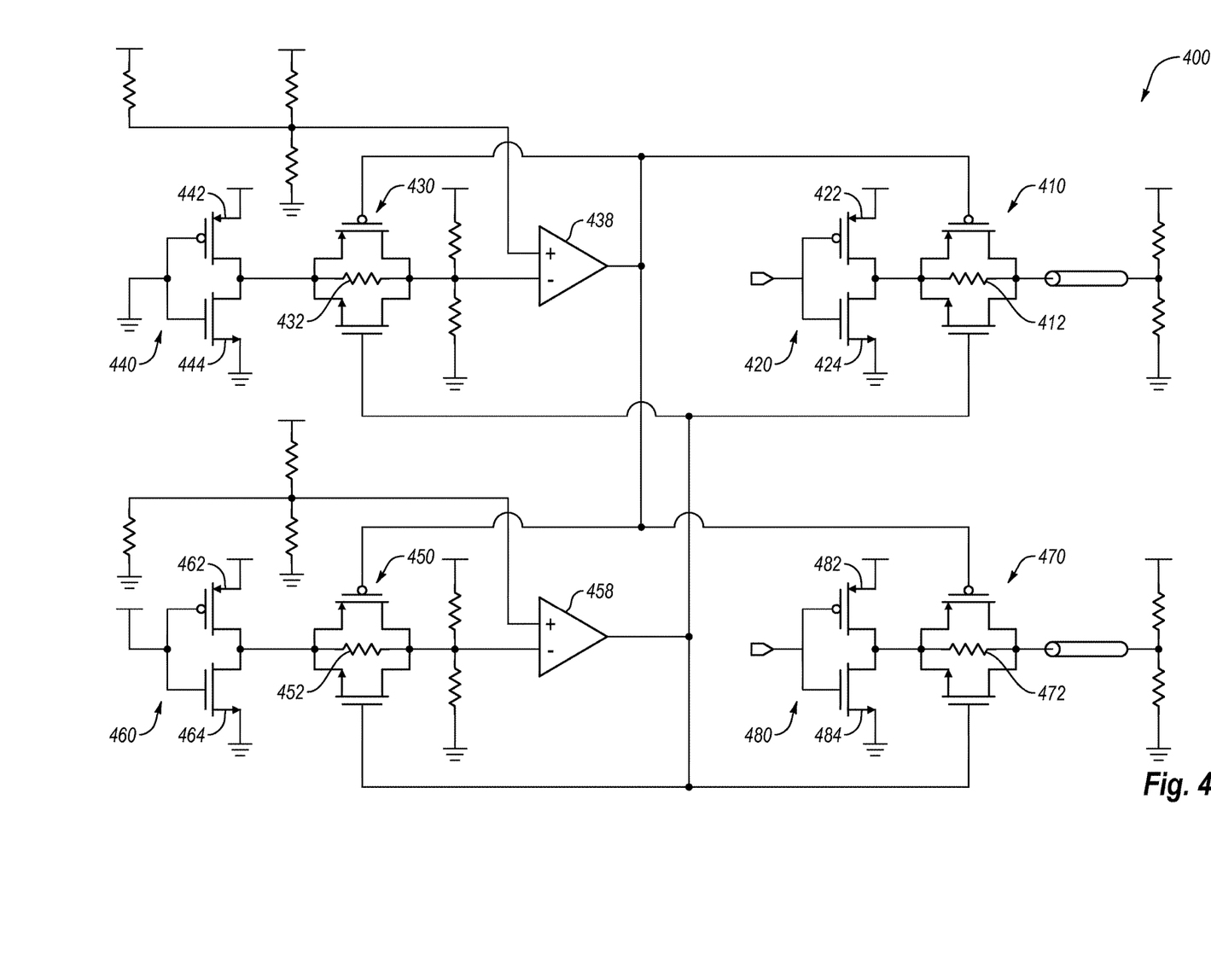
FIG. 4 is a diagram of another example circuit for impedance matching.

FIG. 4 is a diagram of the example circuit 400 for impedance matching, arranged in accordance with at least one embodiment described herein. The circuit 400 may be analogous in operation to the circuit 300 of FIG. 3. The circuit 400 may illustrate an example implementation of the driver circuits of FIG. 3. Furthermore, the circuit 400 may illustrate another implementation of the adjustable impedance circuits of FIGS. 2 and 3.

The circuit 400 includes first and second driver circuits 420 and 480, a replica first driver circuit 440, and a second replica second driver circuit 460, referred to herein as the driver circuits 420, 440, 460, and 480. The replica first driver circuit 440 may be a scaled replica of the first driver circuit 420. The replica second driver circuit 460 may be a scaled replica of the second driver circuit 480.

The circuit 400 may further include first and second adjustable impedance circuits 410 and 470, a replica first adjustable impedance circuit 430, and a replica second adjustable impedance circuit 450, referred to herein as the adjustable impedance circuits 410, 430, 450, and 470. The replica first adjustable impedance circuit 430 may be a scaled replica of the first adjustable impedance circuit 410. The replica second adjustable impedance circuit 450 may be a scaled replica of the second adjustable impedance circuit 470.

The circuit 400 may further include first and second differential amplifiers 438 and 458, which may be analogous to the first and second differential amplifiers 338 and 358 of FIG. 3.

Each of the driver circuits 420, 440, 460, and 480 may include two transistors that are arranged such that the driver circuits 420, 440, 460, and 480 operate as inverters. In particular, each of the driver circuits 420, 440, 460, and 480 may be a voltage mode driver circuit. Each of the transistors may include a gate terminal, a source terminal, and a drain terminal. As illustrated in FIG. 4, the source terminal may be the terminal with the arrow, the gate terminal may be the terminal with the parallel horizontal lines, and the drain terminal may be the other terminal.

The first driver circuit 420 includes a first transistor 422 and a second transistor 424. The gates of the first and second transistors 422 and 424 may be coupled to a signal input. The drains of the first and second transistors 422 and 424 may be coupled to the first adjustable impedance circuit 410.

The source of the first transistor 422 may be coupled to VCC. The source of the second transistor 424 may be coupled to ground.

The replica first driver circuit 440 includes a first transistor 442 and a second transistor 444. The gates of the first and second transistors 442 and 444 may be coupled to ground. The drains of the first and second transistors 442 and 444 may be coupled to the replica first adjustable impedance circuit 430. The source of the first transistor 442 may be coupled to VCC. The source of the second transistor 444 may be coupled to ground. As configured, the replica first driver circuit 440, being an inverter, may output a signal in a first state, such as a high state or logical high state.

The replica second driver circuit 460 includes a first transistor 462 and a second transistor 464. The gates of the first and second transistors 462 and 464 may be coupled to VCC. The drains of the first and second transistors 462 and 464 may be coupled to the replica second adjustable impedance circuit 450. The source of the first transistor 462 may be coupled to VCC. The source of the second transistor 464 may be coupled to ground. As configured, the replica second driver circuit 460, being an inverter, may output a signal in a second state, such as a low state or logical low state.

The second driver circuit 480 includes a first transistor 482 and a second transistor 484. The gates of the first and second transistors 482 and 484 may be coupled to a signal input. The drains of the first and second transistors 482 and 484 may be coupled to the second adjustable impedance circuit 470. The source of the first transistor 482 may be coupled to VCC. The source of the second transistor 484 may be coupled to ground.

The adjustable impedance circuits 410, 430, 450, and 470 may each include a resistance. For example, the first adjustable impedance circuit 410 may include a first resistance 412 coupled between the first driver circuit 420 and a first signal transmission line. The second adjustable impedance circuit 470 may include a fourth resistance 472 coupled between the second driver circuit 480 and a second signal transmission line. The replica first adjustable impedance circuit 430 may include a second resistance 432 coupled between the replica first driver circuit 440 and the first differential amplifier 438. The replica second adjustable impedance circuit 450 may include a third resistance 452 coupled between the replica second driver circuit 460 and the second differential amplifier 458.

The first, second, third, and fourth resistances 412, 432, 452, and 472, may each be configured to contribute to the output impedance of their respective adjustable impedance circuits 410, 430, 450, and 470. As a result, the size of the transistors in the adjustable impedance circuits 410, 430, 450, and 470 may be reduced as the output impedance contributed by the transistors in the adjustable impedance circuits 410, 430, 450, and 470 is reduced. Reducing the size of the transistors may reduce the capacitance of the adjustable impedance circuits 410, 430, 450, and 470.

Additionally, the impedance adjusting range of the adjustable impedance circuits 410, 430, 450, and 470 may be reduced when the circuit 400 includes the first, second, third, and fourth resistances 412, 432, 452, and 472. For example, without the first, second, third, and fourth resistances 412, 432, 452, and 472, the adjustable impedance circuits 410, 430, 450, and 470 may be configured to adjust their output impedance over a 30 ohm swing. With the first, second, third, and fourth resistances 412, 432, 452, and 472 including a 20 ohm resistance, the adjustable impedance circuits 410, 430, 450, and 470 may be configured to adjust their output impedance over a 10 ohm swing.

Modifications, additions, or omissions may be made to the circuit 400 without departing from the scope of the present disclosure. For example, in some embodiments, the circuit 400 may include one or more additional active or passive devices. Alternately or additionally, the circuit 400 may not include the first, second, third, and fourth resistances 412, 432, 452, and 472.

In FIGS. 2, 3, and 4, the illustrated transistors are illustrated as metal-oxide-semiconductor field-effect transistor (MOSFET) transistors. The above description uses the nomenclature gate, source, and drain to represent different terminals of the transistors. The use of the names gate, source, and drain may be used to describe generically the terminals of a MOSFET transistor, or other types of transistors, such as bipolar junction transistors (BJT), junction gate field-effect transistors (JFET), and insulated gate bipolar transistors. Furthermore, in some embodiments, some combination of n-type and p-type transistors may also be used other than that illustrated.

Figure 5:
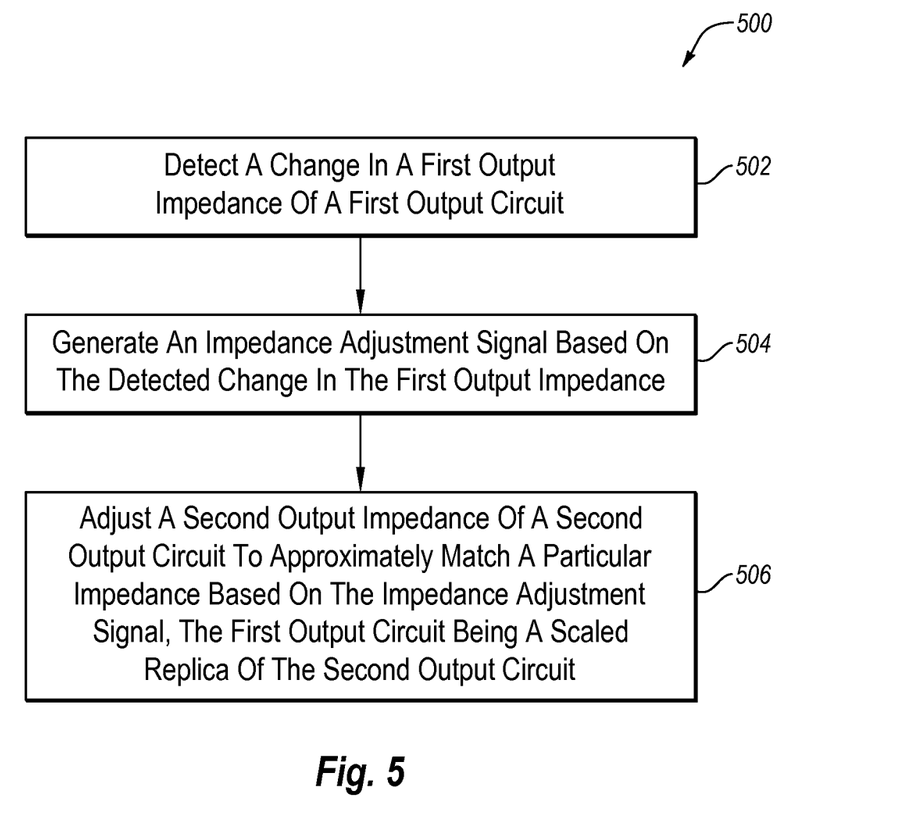
FIG. 5 is a flowchart of an example method of matching impedances.

FIG. 5 is a flowchart of an example method 500 of matching impedances, arranged in accordance with at least one embodiment described herein. The method 500 may be implemented, in some embodiments, by a circuit, such as the circuits 100, 200, 300, or 400 of FIGS. 1, 2, 3, and 4. Although illustrated as discrete blocks, various blocks may be divided into additional blocks, combined into fewer blocks, or eliminated, depending on the desired implementation.

The method 500 may begin at block 502, where a change in a first output impedance of a first output circuit may be detected. In some embodiments, detecting a change in the first output impedance may include generating a first voltage using an impedance circuit with an impedance circuit impedance related to the particular impedance and generating a second voltage using the first output circuit. Detecting the change may further include comparing the first voltage and the second voltage to determine a difference between the first voltage and the second voltage. The change in the first output impedance of the first output circuit may be based on the difference between the first voltage and the second voltage.

In block 504, an impedance adjustment signal may be generated based on the detected change in the first output impedance. In some embodiments, the second voltage may be generated using the first output circuit and the impedance adjustment signal.

In block 506, a second output impedance of a second output circuit may be adjusted to approximately match a particular impedance based on the impedance adjustment signal, the first output circuit being a scaled replica of the second output circuit.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the first output circuit may be a scaled replica of the second output circuit based on a first ratio between transistor widths of the first output circuit compared to transistor widths of the second output circuit. In these and other embodiments, the method 500 may further include adjusting the first ratio between the transistor widths of the first output circuit compared to the transistor widths of the second output circuit based on a second ratio between the impedance circuit impedance and the particular impedance.

As another example, the method 500 may further include detecting a change in a third output impedance of a third output circuit and generating a second impedance adjustment signal based on the detected change in the third output impedance. Alternately or additionally, the method 500 may further include adjusting a fourth output impedance of the second output circuit to approximately match the particular impedance based on the second impedance adjustment signal. In these and other embodiments, the third output circuit may be a scaled replica of the second output circuit. In some embodiments, the second output impedance of the second output circuit may be a first adjustable impedance of a first circuit element of the second output circuit that passes a first state of an output signal driven by the second output circuit. Alternately or additionally, the fourth output impedance of the second output circuit may a second adjustable impedance of a second circuit element of the second output circuit that passes a second state of the output signal driven by the second output circuit.

As another example, the method 500 may further include driving an output signal onto a signal transmission line using the second output circuit at a same time as the second output impedance of the second output circuit is adjusted.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended as pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit, comprising:
an output circuit with an output circuit output impedance, the output circuit includes:
a driver circuit that includes an output terminal and a driver circuit output impedance at the output terminal; and
an adjustable impedance circuit that includes an adjustable impedance, the adjustable impedance circuit coupled between the output terminal of the driver circuit and a signal transmission line, the output circuit output impedance based on the driver circuit output impedance and the adjustable impedance; and
a control circuit coupled to the adjustable impedance circuit, the control circuit including:
a first portion configured to generate and to use a first impedance adjust voltage and to provide the first impedance adjust voltage to the adjustable impedance circuit; and
a second portion configured to use the first impedance adjust voltage, to generate and use a second impedance adjust voltage, and to provide the second impedance adjust voltage to the adjustable impedance circuit and to the first portion,
wherein the first portion provides the first impedance adjust voltage to the second portion and uses the second impedance adjust voltage and wherein the control circuit is configured to adjust the adjustable impedance of the adjustable impedance circuit based on the first impedance adjust voltage and the second impedance adjust voltage such that the output circuit output impedance approximately equals a particular impedance.

2. The circuit of claim 1, wherein the output circuit is configured to be coupled to the signal transmission line with an input impedance that approximately equals the particular impedance, wherein the adjustable impedance circuit includes an adjustable resistance coupled in series between the driver circuit and the signal transmission line.

3. The circuit of claim 2, further comprising a fixed resistance coupled in series between the driver circuit and the signal transmission line and in parallel with the adjustable impedance circuit.

4. The circuit of claim 1, wherein the driver circuit is configured to drive an output signal on the output terminal and the adjustable impedance circuit includes a first transistor configured to pass the output signal in a first state and a second transistor configured to pass the output signal in a second state, wherein the control circuit is configured to adjust a first transistor output impedance of the first transistor to approximately equal the particular impedance and to adjust a second transistor output impedance of the second transistor to approximately equal the particular impedance.

5. The circuit of claim 4, wherein:
the driver circuit includes a voltage mode driver circuit;
the first transistor is a p-type transistor coupled to the output terminal; and
the second transistor is an n-type transistor coupled to the output terminal.

6. The circuit of claim 1, wherein:
the first portion includes:
a first impedance circuit with a first impedance circuit impedance related to the particular impedance;
a first replica output circuit that is a scaled replica of the output circuit, wherein the first replica output circuit includes a first replica driver circuit and a first replica adjustable impedance circuit; and
a first comparison circuit configured to generate the first impedance adjust voltage based on a comparison of a first voltage generated based on the first impedance circuit and a second voltage generated based on the first replica output circuit; and
the second portion includes:
a second impedance circuit with a second impedance circuit impedance related to the particular impedance;
a second replica output circuit that is a scaled replica of the output circuit, wherein the second replica output circuit includes a second replica driver circuit and second replica adjustable impedance circuit; and
a second comparison circuit configured to generate the second impedance adjust voltage based on a comparison of a third voltage generated by the second impedance circuit and a fourth voltage generated by the second replica output circuit.

7. The circuit of claim 6, wherein:
the first voltage is generated based on the first impedance circuit and a replica first load circuit that is a scaled replica of a load circuit coupled to the output circuit;
the second voltage is generated based on the first replica output circuit and a second load circuit that is a scaled replica of the load circuit, wherein a first replica adjustable impedance of the first replica adjustable impedance circuit is adjusted based on the first impedance adjust voltage and the second impedance adjust voltage;

the third voltage is generated based on the second impedance circuit and a third load circuit that is a scaled replica of the load circuit coupled to the output circuit; and the fourth voltage is generated based on the second replica output circuit and a fourth load circuit that is a scaled replica of the load circuit, wherein a second replica adjustable impedance of the second replica adjustable impedance circuit is adjusted based on the second impedance adjust voltage and the first impedance adjust voltage.

8. The circuit of claim 6, wherein the first impedance circuit impedance is related to the particular impedance based on a first ratio that is equal to a second ratio between widths of first and second transistors of the adjustable impedance circuit and widths of replica first and second transistors of the first replica adjustable impedance circuit.

9. The circuit of claim 6, wherein the first replica output circuit and the second replica output circuit are scaled replicas of the output circuit.

10. The circuit of claim 1, wherein the output circuit is a first output circuit and the circuit is configured for differential signals, wherein the circuit further includes:

a second output circuit with a second output circuit output impedance, the second output circuit includes:
    a second driver circuit that includes a second output terminal and a second driver circuit output impedance at the second output terminal; and
    a second adjustable impedance circuit that includes a second adjustable impedance, the second adjustable impedance circuit coupled between the second output terminal of the second driver circuit and a second signal transmission line, the second output circuit output impedance based on the second driver circuit output impedance and the second adjustable impedance, wherein the control circuit is coupled to the second adjustable impedance circuit, the control circuit configured to adjust the second adjustable impedance of the second adjustable impedance circuit such that the second output circuit output impedance approximately equals the particular impedance.

11. The circuit of claim 1 wherein the particular impedance is 50 ohms.

12. A circuit, comprising:
an output circuit with an output circuit output impedance, the output circuit includes an adjustable impedance circuit that includes an adjustable impedance, the output circuit output impedance based on the adjustable impedance;

a first replica output circuit configured to output a first voltage, the first replica output circuit being a replica of the output circuit;

a first comparison circuit configured to generate a first impedance adjust voltage based on a comparison of the first voltage and a second voltage related to a particular impedance;

a second replica output circuit configured to output a third voltage, the second replica output circuit being a replica of the output circuit; and a second comparison circuit configured to generate a second impedance adjust voltage based on a comparison of the third voltage and a fourth voltage related to the particular impedance, wherein the first impedance adjust voltage and the second impedance adjust voltage are provided to:
    the first replica output circuit to adjust a first replica impedance of the first replica output circuit,
    the second replica output circuit to adjust a second replica impedance of the second replica output circuit, and
    the adjustable impedance circuit to adjust the adjustable impedance such that the output circuit output impedance approximately equals the particular impedance.

13. The circuit of claim 12, wherein the adjustable impedance circuit includes: a first transistor that includes a first gate and a first adjustable transistor output impedance, the first gate of the first transistor coupled to the first comparison circuit to receive the first impedance adjust voltage, the first impedance adjust voltage adjusting the first adjustable transistor output impedance of the first transistor such that the adjustable impedance of the adjustable impedance circuit is adjusted.

14. The circuit of claim 13, wherein the adjustable impedance circuit further includes: a second transistor that includes a second gate and a second adjustable transistor output impedance, the second gate of the second transistor coupled to the second comparison circuit to receive the second impedance adjust voltage, the second impedance adjust voltage adjusting the second adjustable transistor output impedance of the second transistor such that the adjustable impedance of the adjustable impedance circuit is adjusted.

15. The circuit of claim 14, wherein the adjustable impedance circuit further includes a fixed resistance, wherein the fixed resistance, the first transistor, and the second transistor are coupled in parallel.

16. The circuit of claim 12, wherein the output circuit is configured to be coupled to a signal transmission line with an input impedance that approximately equals the particular impedance.

17. The circuit of claim 12, wherein the first replica output circuit is a scaled replica of the output circuit and the second replica output circuit is a scaled replica of the output circuit.

* * * * *